(12) United States Patent
Fujii et al.

(10) Patent No.: US 7,733,986 B2
(45) Date of Patent: Jun. 8, 2010

(54) RECEIVER AND ELECTRONIC APPARATUS

(75) Inventors: Takeshi Fujii, Osaka (JP); Hiroaki Ozeki, Osaka (JP)

(73) Assignee: Panasonic Corporation, Osaka (JP)

(*) Notice: Subject to any disclaimer, the term of this patent is extended or adjusted under 35 U.S.C. 154(b) by 678 days.

(21) Appl. No.: 11/572,942

(22) PCT Filed: Jun. 8, 2006

(86) PCT No.: PCT/JP2006/011505

§ 371 (c)(1),
(2), (4) Date: Jan. 30, 2007

(87) PCT Pub. No.: WO2007/013226

PCT Pub. Date: Feb. 1, 2007

(65) Prior Publication Data
US 2009/0232259 A1 Sep. 17, 2009

(30) Foreign Application Priority Data

Jul. 29, 2005 (JP) .............................. 2005-219960

(51) Int. Cl.
*H03D 3/24* (2006.01)
(52) U.S. Cl. .................. 375/327; 375/344; 375/376
(58) Field of Classification Search ............... 375/326, 375/327, 344, 371, 373, 376, 260
See application file for complete search history.

(56) References Cited

U.S. PATENT DOCUMENTS 5,970,105 A * 10/1999 Dacus ..................... 375/344
5,987,074 A   11/1999 Wakamatsu
6,720,824 B2 *  4/2004 Hyakudai et al. ........... 329/304
7,356,103 B2 *  4/2008 Nishikawa .................. 375/345

FOREIGN PATENT DOCUMENTS

| CN | 1169631 A | 1/1998 |
|---|---|---|
| JP | 02-049223 | 4/1990 |
| JP | 10-284997 | 10/1998 |
| JP | 11-112460 | 4/1999 |
| JP | 2001-036386 | 2/2001 |
| JP | 2001-36386 A | 2/2001 |
| JP | 2002-064457 | 2/2002 |
| JP | 2002-64457 A | 2/2002 |
| JP | 2004-222192 | 8/2004 |
| JP | 2004-222192 A | 8/2004 |

OTHER PUBLICATIONS

Japanese Search Report for Application No. PCT/JP2006/311505 dated Aug. 29, 2006.
English translation of Form PCT/ISA/210.

* cited by examiner

*Primary Examiner*—David B Lugo
(74) *Attorney, Agent, or Firm*—RatnerPrestia (57) ABSTRACT

A receiver has a receiving unit including a PLL, a mixer, and a filter, and demodulating unit including a frequency error detector for detecting a frequency error in a signal from a filter. The PLL includes a local oscillator for supplying a local oscillation signal to a mixer, a variable frequency divider for frequency-dividing the local oscillation signal based on a signal from the frequency error detector, and a phase comparator for comparing a signal from the variable frequency divider with a signal from a crystal oscillator. The PLL can reduce the frequency error of the local oscillation signal.

8 Claims, 8 Drawing Sheets

RECEIVER AND ELECTRONIC APPARATUS

This application is a U.S. National Phase application of PCT International Application PCT/JP2006/311505

TECHNICAL FIELD

The present invention relates to a receiver for receiving a signal and an electronic apparatus using it.

BACKGROUND ART

Terrestrial digital broadcasting service has been begun, and receivers for receiving the broadcasting service have been developed actively. Japanese Patent Unexamined Publication No. H11-112460 discloses an orthogonal-frequency-division-multiplex (OFDM) signal demodulator that can receive such broadcasting service and shorten the locking time of the frequency synchronization.

Figure 8:
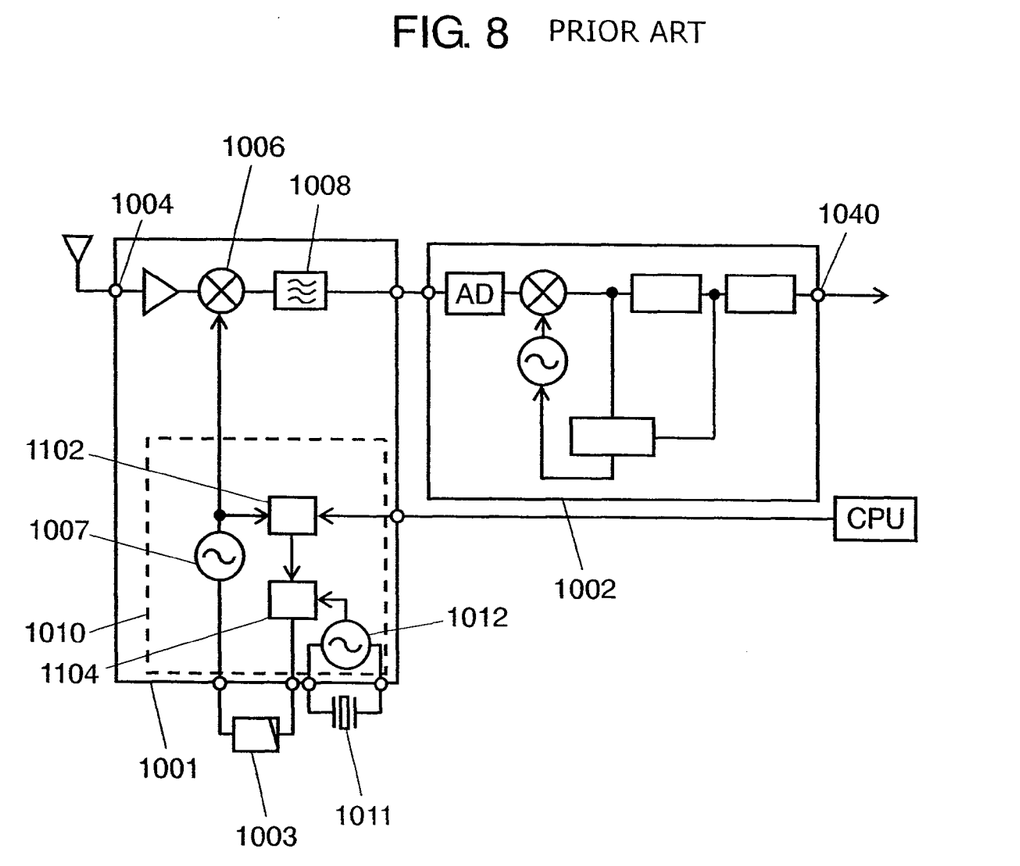
FIG. 8 is a block diagram of a conventional receiver.

A conventional receiver will be described hereinafter with reference to the drawing. FIG. 8 is a circuit block of the conventional receiver. In FIG. 8, the receiver has the following elements:
  input terminal 1004;
  receiving unit 1001 connected to input terminal 1004;
  demodulating unit 1002 connected to the output side of receiving unit 1001; and
  output terminal 1040 connected to the output side of demodulating unit 1002.

Receiving unit 1001 has the following elements:
  phase locked loop (PLL) 1010;
  mixer 1006 for mixing local oscillation signals from PLL 1010 and signals from input terminal 1004; and
  filter 1008 connected to the output side of mixer 1006.

PLL 1010 has the following elements:
  local oscillator 1007 for supplying the local oscillation signals to mixer 1006;
  variable frequency divider 1102 for frequency-dividing the local oscillation signals from local oscillator 1007;
  crystal oscillator 1012; and
  phase comparator 1104 that is connected to the input side of local oscillator 1007 and compares signals from variable frequency divider 1102 with signals from crystal oscillator 1012.

The output part of phase comparator 1104 is connected to the input part of local oscillator 1007 via loop filter 1003.

In the conventional receiver having such a configuration, variation in temperature causes a frequency error in signals of quartz crystal 1011. The frequency error in the signals of quartz crystal 1011 is about 100 ppm or lower. When the reference frequency of the signals of quartz crystal 1011 is assumed to be 18 MHz, for example, the frequency error range is ±1.8 kHz, extremely small. The output frequency of the local oscillation signals from local oscillator 1007 that are generated based on the error-included signals from quartz crystal 1011 includes a frequency error of the value derived by multiplying the error by the ratio between the output frequency of the local oscillation signals and the reference frequency of the signals of quartz crystal 1011. A large frequency error occurs in the output frequency of the local oscillation signals.

When the local oscillation signals including such a large frequency error that have been supplied from local oscillator 1007 are fed into mixer 1006, the selected intermediate frequency (IF) signals supplied from mixer 1006 have a similar frequency error. Therefore, filter 1008 for removing undesired signals from the IF signals supplied from mixer 1006 must have a pass band width of desired signals that is larger by a band width corresponding to the frequency error. As a result, the attenuation characteristic of filter 1008 is not steep, and the attenuation amount of unnecessary undesired signals existing near the frequency of the desired signals decreases inevitably.

SUMMARY OF THE INVENTION

The receiver has the following elements:
  an input terminal;
  a receiving unit connected to the input terminal;
  a demodulating unit connected to the output side of the receiving unit; and
  an output terminal connected to the output side of the demodulating unit.

The receiving unit has the following elements:
  a PLL;
  a mixer for mixing local oscillation signals from the PLL and signals from the input terminal; and
  a filter connected to the output side of the mixer.

The demodulating unit has a frequency error detector for detecting a frequency error in signals from the filter. The PLL has the following elements:
  a local oscillator for supplying the local oscillation signals to the mixer;
  a variable frequency divider for frequency-dividing the local oscillation signals from the local oscillator at a frequency division ratio that is determined based on signals from the frequency error detector;
  an oscillator; and
  a phase comparator that is connected to the input side of the local oscillator and compares signals from the variable frequency divider with signals from the oscillator.

Thanks to such a configuration, the receiver can reduce the frequency error in the local oscillation signals by operating the variable frequency divider based on the signals from the frequency error detector. Thus, the frequency error in IF signals supplied from the mixer becomes small, and the pass band width of the filter for passing only desired signals can be reduced. The attenuation characteristic of the filter therefore becomes steep, and the attenuation amount of unnecessary undesired signals existing near the frequency of the desired signals can be increased.

An electronic apparatus has the following elements:
  an input terminal;
  a receiving unit connected to the input terminal;
  a demodulating unit connected to the output side of the receiving unit;
  an output terminal connected to the output side of the demodulating unit;
  a signal processing unit connected to the output terminal; and
  a display unit connected to the signal processing unit.

The receiving unit has the following elements:
  a PLL;
  a mixer for mixing local oscillation signals from the PLL and signals from the input terminal; and
  a filter connected to the output side of the mixer.

The demodulating unit has a frequency error detector for detecting a frequency error in signals from the filter. The PLL has the following elements:

a local oscillator for supplying the local oscillation signals to the mixer;

a variable frequency divider for frequency-dividing the local oscillation signals from the local oscillator at a frequency division ratio that is determined based on signals from the frequency error detector;

an oscillator; and a phase comparator that is connected to the input side of the local oscillator and compares signals from the variable frequency divider with signals from the oscillator.

Thanks to such a configuration, the electronic apparatus can reduce the frequency error in the local oscillation signals by operating the variable frequency divider based on the signals from the frequency error detector. Thus, the frequency error in IF signals supplied from the mixer becomes small, and the pass band width of the filter for passing only desired signals can be reduced. The attenuation characteristic of the filter therefore becomes steep, and the attenuation amount of unnecessary undesired signals existing near the frequency of the desired signals can be increased.

REFERENCE MARKS IN THE DRAWINGS 1 receiving unit
2 demodulating unit
3 antenna
4 input terminal
5 radio-frequency amplifier
6 mixer
7 local oscillator
8 band limiting filter
10 phase locked loop (PLL)
11 quartz crystal
12 crystal oscillator
13 loop filter
20 analog-to-digital (AD) converter
21 multiplier
22 Fourier transformer
23 demodulator
24 frequency error detector
25 frequency controller
26 numerically controlled oscillator (NCO)
30 CPU
40 output terminal
60 memory
102 variable frequency divider
104 phase comparator
200 signal processing unit
201 display unit

DETAILED DESCRIPTION OF PREFERRED EMBODIMENTS

Exemplary embodiments of the present invention will be described with reference to the drawings.

Exemplary Embodiment 1

Figure 1:
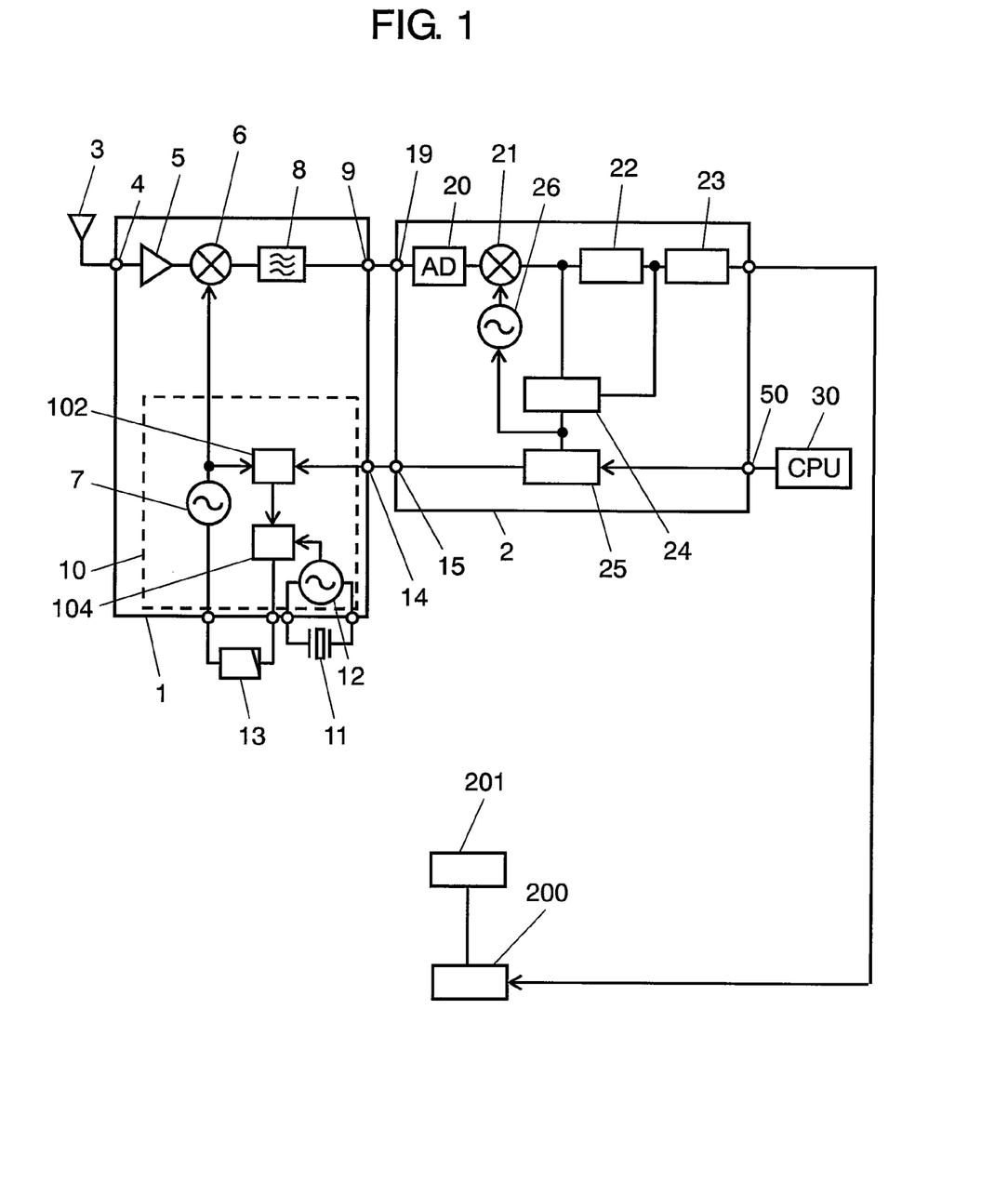
FIG. 1 is a block diagram of a receiver and an electronic apparatus using it in accordance with exemplary embodiment 1 of the present invention.
Figure 2:
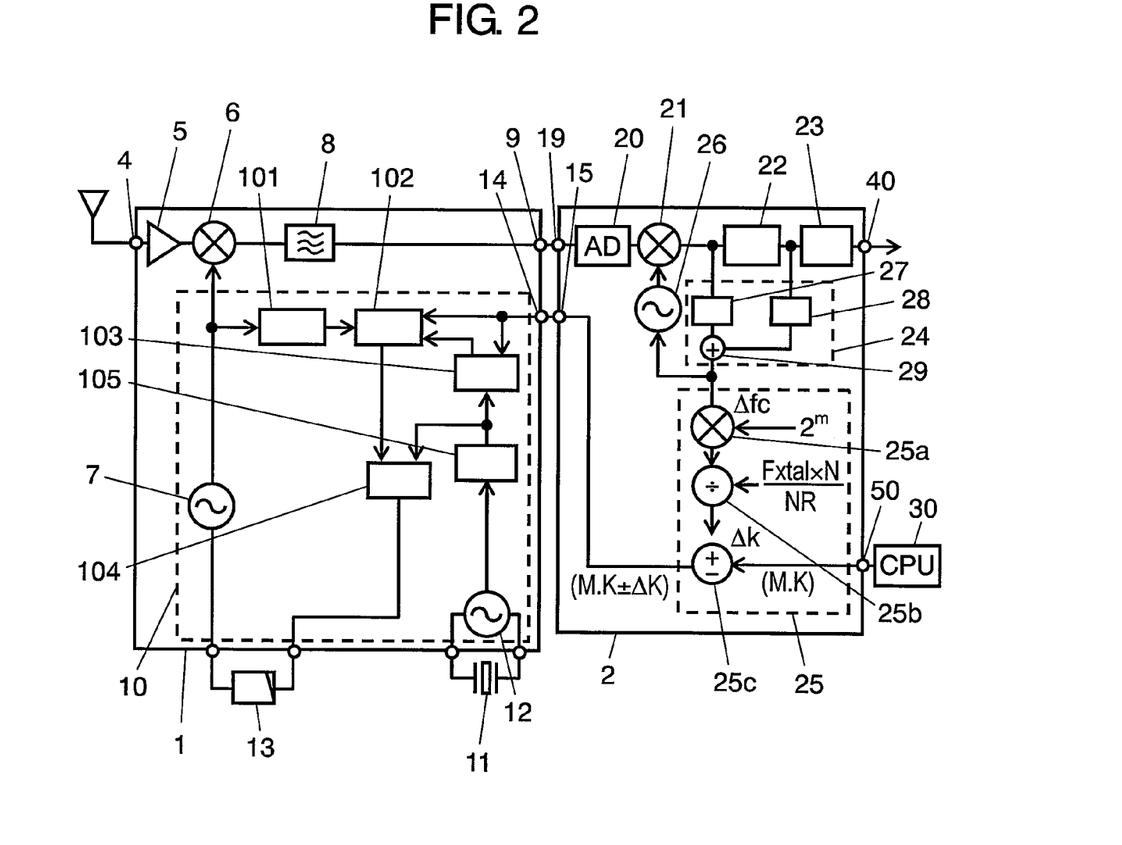
FIG. 2 is a detailed block diagram of the receiver in accordance with exemplary embodiment 1.

A receiver of exemplary embodiment 1 of the present invention is described with reference to FIG. 1 and FIG. 2. FIG. 1 is a block diagram of a receiver and an electronic apparatus using it in accordance with exemplary embodiment 1 of the present invention. FIG. 2 is a detailed block diagram of the receiver. The present embodiment describes a case where the receiver receives terrestrial digital broadcasting signals.

In FIG. 1, the receiver has the following elements:
input terminal 4;
receiving unit 1 connected to input terminal 4;
demodulating unit 2 connected to the output side of receiving unit 1; and
output terminal 40 connected to the output side of demodulating unit 2.

The receiver also has CPU connection terminal 50 for inputting data of CPU 30 for controlling them. An electronic apparatus including the receiver has signal processing unit 200 connected to output terminal 40, and display unit 201 connected to the signal processing unit.

Receiving unit 1 has the following elements:
an input filter (not shown);
radio-frequency amplifier 5;
PLL 10;
mixer 6 for mixing local oscillation signals from PLL 10 and signals from input terminal 4; and
band limiting filter 8 as a filter for limiting the frequency band that is connected to the output side of mixer 6.

The input filter intensively suppresses an unnecessary frequency band other than the television (TV) broadcasting signal band from broad received radio wave, and selects received signals for TV.

Radio-frequency amplifier 5 amplifies the signals from the input filter and then supplies them to one input part of mixer 6.

Mixer 6 converts frequency of supplied signals from input terminal 4 via the input filter and radio-frequency amplifier based on the local oscillation signals from PLL 10, and outputs the signals as IF signals to band limiting filter 8.

Band limiting filter 8 receives the IF signals and suppresses unnecessary interfering signals existing at frequency near that of the IF signals. Desired
demodulating unit 2 connected to the output side of receiving unit 1; and
output terminal 40 connected to the output side of demodulating unit 2.

The receiver also has an input terminal for inputting data of CPU 30 for controlling them. An electronic apparatus including the receiver has signal processing unit 200 connected to output terminal 40, and display unit 201 connected to the signal processing unit.

Receiving unit 1 has the following elements:
an input filter (not shown);
radio-frequency amplifier 5;
PLL 10;
mixer 6 for mixing local oscillation signals from PLL 10 and signals from input terminal 4; and
band limiting filter 8 as a filter for limiting the frequency band that is connected to the output side of mixer 6.

The input filter intensively suppresses an unnecessary frequency band other than the television (TV) broadcasting signal band from broad received radio wave, and selects received signals for TV.

Radio-frequency amplifier 5 amplifies the signals from the input filter and then supplies them to one input part of mixer 6.

Mixer 6 converts frequency of supplied signals from input terminal 4 via the input filter and radio-frequency amplifier based on the local oscillation signals from PLL 10, and outputs the signals as IF signals to band limiting filter 8.

Band limiting filter 8 receives the IF signals and suppresses unnecessary interfering signals existing at frequency near that of the IF signals. Desired signals of the output signals of band limiting filter 8 are gain-controlled to a certain output level by a low-frequency amplifier (not shown).

In FIG. 2, PLL 10 has crystal oscillator 12 connected to quartz crystal 11, and local oscillator 7 for supplying local oscillation signals to mixer 6. PLL 10 also has the following elements:
pre-scaler 101 for frequency-dividing the local oscillation signals from local oscillator 7; and
variable frequency divider 102 for frequency-dividing signals from pre-scaler 101 based on signals from frequency controller 25 that is connected to frequency error detector 24 of demodulating unit 2 for detecting a frequency error in the signals from band limiting filter 8.

PLL 10 also has the following elements:
reference frequency divider 105 for frequency-dividing signals from crystal oscillator 12 for an oscillator; and
phase comparator 104 for comparing signals from reference frequency divider 105 with signals from variable frequency divider 102.

The output part of phase comparator 104 is connected to the input part of local oscillator 7 via loop filter 13. PLL 10 also has accumulating adder 103 that receives the signals from reference frequency divider 105 and the signals from frequency controller 25, and supplies overflow signals (hereinafter referred to as "OVF signals") to variable frequency divider 102.

Each block constituting demodulating unit 2 of FIG. 2 is described hereinafter.

Demodulating unit 2 has the following elements:
AD converter (represented by "AD" in FIG. 2) 20 connected to the output side of band limiting filter 8;
a digital filer (not shown) connected to the output side of AD converter 20;
multiplier 21 connected to the output side of the digital filer; and
Fourier transformer 22 and demodulator 23 connected between multiplier 21 and output terminal 40.

Output terminal 40 outputs data such as video and audio demodulated digitally. Demodulating unit 2 also has frequency error detector 24 for detecting a frequency error based on the signals from multiplier 21 before and after Fourier transformation by Fourier transformer 22. Demodulating unit 2 also has frequency controller 25 connected to the output part of frequency error detector 24, and numerically controlled oscillator (NCO) 26.

AD converter 20 converts input analog signals into digital signals.

The digital filter removes interfering signals.

Multiplier 21 converts input desired signals into orthogonally demodulated complex signals, frequency-converts the complex signals into base band orthogonal frequency division multiplexing (OFDM) signals having no carrier wave component, and outputs the OFDM signals.

Fourier transformer 22 converts a data string of the time region of the input base band OFDM signals into data string of the frequency region.

Demodulator 23 demodulates the data string of the frequency region, namely digital signal data obtained by modulating each carrier of the OFDM signals. The demodulated data undergoes error correction and then is supplied as information such as audio and video via output terminal 40.

Correction of carrier frequency offset is described hereinafter. The carrier frequency offset is corrected with a circuit formed of frequency error detector 24, NCO 26, and multiplier 21.

In FIG. 2, frequency error detector 24 has narrow-band frequency error detector 27, broadband frequency error detector 28, and adder 29. Narrow-band frequency error detector 27 receives signals from the multiplier and detects a fine frequency error within a carrier spacing in the OFDM signals. The data in the guard interval duration for the OFDM signals is obtained by copying the back part data of the useful symbol duration, so that the frequency error within the carrier spacing is calculated using the correlation between these signals.

Broadband frequency error detector 28 receives signals from Fourier transformer 22 and detects a frequency error on the order of the carrier spacing. The frequency error on the order of the carrier spacing is calculated using a reference symbol for frequency synchronization that is inserted in a predetermined cycle on the transmission side.

Adder 29 adds the detection error of broadband frequency error detector 28 to the detection error of narrow-band frequency error detector 27, and supplies the added frequency error data to frequency controller 25 and an NCO controller (not shown). When there is an frequency error, based on the frequency error amount detected by frequency error detector 24, the NCO controller supplies frequency error data equivalent to the frequency offset so as to cancel frequency error if any, and controls the output frequency of NCO 26. Output signals of NCO 26 are supplied to the other input part of multiplier 21.

Thus, frequency error detector 24 detects a frequency error with narrow-band frequency error detector 27 using signals in the guard interval durations characterized by OFDM modulated signals, and detects a frequency error with broadband frequency error detector 28 using a reference symbol called a pilot signal.

The above-mentioned correction of carrier frequency offset that is performed with frequency error detector 24, NCO 26, and multiplier 21 of demodulating unit 2 is especially important in demodulating the OFDN-modulated desired signals. When signals such as OFDM signals where orthogonal carriers are frequency-multiplexed are demodulated under the existing condition of frequency offset, orthogonality between carriers breaks to cause a large error in the demodulation result. The correction of carrier frequency offset therefore prevents the large error from occurring in the demodulation output.

Frequency controller 25 receives the preset data for PLL selection from CPU 30 in addition to the frequency error data from frequency error detector 24. Frequency controller 25 supplies a result of the numerical calculation performed using the frequency error data and data for PLL selection, as new data for PLL selection, to variable frequency divider 102 of PLL 10.

Signal processing in the receiver is described hereinafter.

Data "M, K" for selection that indicates a frequency division ratio preset in variable frequency divider 102 is previously input as an initial state in variable frequency divider 102 of PLL 10. The "M, K" shows an integer frequency division ratio and fractional frequency division ratio of channel selection data fed from CPU 30. Local frequency Fvco of the local oscillation signals supplied from local oscillator 7 is N-frequency-divided by pre-scaler 101, and signals having frequency Fvco/N are fed into variable frequency divider 102.

Frequency Fxtal of the reference frequency signal excited by quartz crystal 11 and crystal oscillator 12 is frequency-divided by reference frequency divider 105 of which frequency division ratio is set at NR. Accumulating adder 103 receives signals having divided frequency Fxtal/NR, and calculates NR/Fxtal, namely time of one cycle. Fractional frequency division ratio K set every cycle by CPU 30 is continuously accumulated and added. When the accumulation and addition result becomes a predetermined additional upper limit $2^m$ or more (where, m is bit number of accumulating adder 103), accumulating adder 103 outputs OVF signals to variable frequency divider 102, subtracts $2^m$ from the calculated accumulation and addition value, and continues similar accumulation and addition.

A series of operations of variable frequency divider 102 and accumulating adder 103 are hereinafter described in detail. Accumulating adder 103 outputs the OVF signals in any predetermined period (NR/Fxtal)×α set for convenience sake, over times of $$\frac{\left(\frac{NR}{Fxtal}\right) \times K}{2^m}. \qquad \text{Eq. 1}$$

At this time, the frequency division ratio of variable frequency divider 102 is set at M+1. In the remaining period when accumulating adder 103 outputs no OVF signal, namely $$\left(\frac{NR}{Fxtal}\right) \times \alpha - \frac{\left(\frac{NR}{Fxtal}\right) \times K}{2^m}, \qquad \text{Eq. 2}$$

the frequency division ratio of variable frequency divider 102 is set at M.

As a result, assuming (NR/Fxtal)=n and α=1 for convenience sake, the average frequency division ratio in a predetermined period (NR/Fxtal)×α is expressed by $$\frac{(M+1)\left(\frac{n \times K}{2^m}\right) + M\left(n \times \alpha - \frac{n \times K}{2^m}\right)}{n \times \alpha} = M + \left(\frac{K}{2^m}\right)\left(\frac{1}{\alpha}\right) \qquad \text{Eq. 3}$$

$$= M + \left(\frac{K}{2^m}\right).$$

Phase comparator 104 compares frequency (Eq. 4) of the signals supplied from variable frequency divider 102 with frequency (Eq. 5) that is obtained by frequency-dividing output frequency Fxtal of a reference signal oscillator at frequency division ratio NR with reference frequency divider 105. Here, $$\frac{Fvco}{N \times \left(M + \frac{K}{2^m}\right)}, \qquad \text{Eq. 4}$$

and $$\frac{Fxtal}{NR}. \qquad \text{Eq. 5}$$

Phase comparator 104 supplies signals corresponding to the phase difference of the input signals, as a voltage value, to local oscillator 7 via loop filter 13.

Thus, the phase difference is eliminated, and Fvco satisfies that Eq. 4=Eq. 5. Fvco is therefore expressed by $$Fvco = \left(M + \frac{K}{2^m}\right) \times N \times \frac{Fxtal}{NR}. \qquad \text{Eq. 6}$$

In other words, local oscillator 7 outputs Fvco, which is the frequency of the local oscillation signals responsive to the channel selection data "M, K" set by CPU 30.

When it is assumed that the combination of the condition of each circuit constituting PLL 10 and set values set by CPU 30 is "Fxtal=18 MHz, NR=3 (frequency division), N=2 (frequency division), m=20, M=63, K=929987", Fvco is 766.643 MHz as shown in $$Fvco = \left(M + \frac{K}{2^m}\right) \times N \times \frac{Fxtal}{NR} \qquad \text{Eq. 7}$$

$$= 766.643 \text{ MHz}.$$

In an actual receiver, however, it is difficult to set the local frequency of local oscillator 7 at the value of Eq. 6. Signals excited by quartz crystal 11 and crystal oscillator 12 for producing reference frequency Fxtal have a frequency error. When a general quartz crystal is employed, the frequency error is about 100 ppm or smaller. When reference frequency Fxtal is assumed to be 18 MHz, the frequency error range is ±1.8 kHz, extremely small. When the reference frequency having the error is expressed by Fxtal*, local oscillator 7 employing reference frequency Fxtal*(=18 MHz±1.8 kHz) including the error causes an error in the local frequency. When the local frequency is expressed by Fvco*, Fvco* has a large frequency error of 76.664 kHz to the local frequency of 766.643 MHz on the same condition as Eq. 7, as shown in $$Fvco^* = \left(M + \frac{K}{2^m}\right) \times N \times \frac{Fxtal^*}{NR} \qquad \text{Eq. 8}$$

$$= 766.643 \text{ MHz} \pm 76.664 \text{ kHz}.$$

Frequency controller 25 of the present embodiment operates so as to correct the error. The operation of frequency controller 25 is described with reference to FIG. 2.

Frequency controller 25 is formed of multiplier 25a, divider 25b, and adder-subtracter 25c. Frequency controller 25 performs calculation for correcting the channel selection data of PLL 10 based on frequency error Δfc in the IF signals from frequency error detector 24. As shown in Eq. 7 and Eq. 8, frequency error Δfc (Δfc=Fvco*−Fvco) in the IF signals is caused in receiving unit 1 by frequency error ΔFxtal (ΔFxtal=Fxtal*−Fxtal) of quartz crystal 11. For removing frequency error Δfc in the IF signals, frequency controller 25 derives new fractional frequency division ratio K* of PLL 10 that outputs correct local frequency Fvco of local oscillator 7 at error-included reference frequency Fxtal*. Thus, correct IF signal frequency is obtained.

First, frequency error Δfc supplied from frequency error detector 24 is fed into multiplier 25a. Multiplier 25a multiplies frequency error "Δfc" by additional upper limit "$2^m$" (where, m is bit number of accumulating adder 103) of accumulating adder 103 of PLL 10, and outputs $2^m \times \Delta fc$.

Next, divider 25b divides $2^m \times \Delta fc$ by "(Fxtal/NR)×N", where "Fxtal" is frequency of the reference frequency signal of PLL 10, "NR" is frequency division ratio of reference frequency divider 105, and "N" is frequency division ratio of pre-scaler 101. Divider 25b outputs the result as correction value ΔK of fractional frequency division ratio K of PLL 10. Therefore, correction value ΔK is expressed by $$\Delta K = \frac{2^m \times \Delta fc}{\left(\frac{Fxtal}{NR}\right) \times N}. \qquad \text{Eq. 9}$$

Here, all of "m", "Fxtal", "NR", and "N" used in above-mentioned calculations are numerical values determined by circuitry of PLL 10. For easily calculating Eq. 9 with frequency controller 25, these numerical values may be preset in demodulating unit 2, or may be previously written from CPU 30 in a storage unit of demodulating unit 2.

Output signal ΔK of divider 25b is fed into one input part of adder-subtracter 25c. Preset data for PLL selection supplied from CPU 30 is fed into the other input part of the adder-subtracter. Preset data is integer frequency division ratio "M" and fractional frequency division ratio "K" of PLL 10.

Adder-subtracter 25c supplies these input signals as integer frequency division ratio "M" without calculation, and supplies "K*" (K*=K±ΔK) derived by adding or subtracting correction value "ΔK" as fractional frequency division ratio "K".

Whether to perform addition or subtraction is determined based on the frequency relation between radio-frequency signals and local oscillation signals of which frequencies are mixed by mixer 6. When the frequency relation is so called "upper local" where the local frequency is higher than the frequency of the radio-frequency signals, it is satisfied that IF frequency=local frequency−radio-frequency signal frequency. Frequency shift directions of the IF frequency and local frequency Fvco become the same. In this case, adder-subtracter 25c outputs "K*" (K*=K−ΔK) derived by subtracting correction value "ΔK" showing the IF frequency difference.

When the frequency relation is so called "lower local" where the local frequency is lower than the frequency of the radio-frequency signals, it is satisfied that IF frequency=radio-frequency signal frequency−local frequency. Frequency shift directions of the IF frequency and local frequency Fvco are opposite directions. When the IF frequency is 550 kHz and is shifted upward from expectation value 500 kHz by 50 kHz, for example, local frequency Fvco* is shifted downward from expectation value Fvco by 50 kHz. In this case, adder-subtracter 25c outputs "K*" (K*=K+ΔK) derived by adding correction value "ΔK" showing the IF frequency difference.

Thus, frequency controller 25 derives correction value "ΔK" of data for PLL selection based on frequency error Δfc fed from frequency error detector 24, and supplies preset data (M, K) for PLL selection fed from CPU 30 to PLL 10 of receiving unit 1 in the form of (M, K±ΔK).

A frequency control of an assumed specific receiving state of the receiver of the present embodiment is described hereinafter.

Received signals of terrestrial digital broadcasting service that are fed into input terminal 4 of receiving unit 1 are supplied as the IF signal frequency from output terminal 9. For example, channel frequency fRF (767.143 MHz) of digital broadcasting signals is fed into input terminal 4. For outputting IF frequency fIF (500 kHz) from output terminal 9, local oscillator 7 outputs 766.643 MHz (Fvco=fRF−fIF) as the expectation value of local frequency Fvco. Local frequency Fvco supplied from local oscillator 7 has been selected and controlled in PLL 10. When it is assumed that the combination of the condition of each circuit constituting PLL 10 and set values preset by CPU 30 is "Fxtal=18 MHz (expectation value), NR=3 (frequency division), N=2 (frequency division), m=20, M=63, K=929987", local oscillator 7 outputs expectation value Fvco=766.643 MHz as shown in Eq. 7.

However, quartz crystal 11 as a signal source of reference frequency Fxtal of PLL 10 can cause an error in output frequency Fxtal=18 MHz (expectation value) with a frequency accuracy of +100 ppm. Therefore, frequency Fxtal*=18 MHz±1.8 kHz is actually output. Based on Fxtal*, local oscillator 7 outputs Fvco* including frequency error 76.664 kHz from the expectation value, which is expressed by $$Fvco^* = \left(M + \frac{K}{2^m}\right) \times N \times \frac{Fxtal^*}{NR} \qquad \text{Eq. 10}$$
$$= 766.643 \text{ MHz} + 76.664 \text{ kHz}.$$

When local frequency Fvco*(Eq. 10) including a frequency error is fed into mixer 6, mixer 6 outputs IF frequency fIF* including frequency error based on the input radio-frequency fRF and local frequency Fvco*. At this time, IF frequency fIF* is 423.336 kHz (fIF*=fRF−Fvco*). The frequency-converted IF signals are supplied from output terminal 9 via band limiting filter 8 or the like, and are fed into input terminal 19 of demodulating unit 2.

In demodulating unit 2, AD converter 20 converts the input IF signals from analog to digital. Multiplier 21 converts the input digital signals to complex signals, and converts them to signals of base band frequency. Fourier transformer 22 transforms input data string of time region to data string of frequency region. Both the output of multiplier 21 and the output of Fourier transformer 22 are fed into frequency error detector 24, and frequency error Δfc of IF signals detected by frequency error detector 24 is obtained and is supplied as frequency error data to frequency controller 25. Here, frequency error Δfc is −76.664 kHz.

Frequency controller 25 calculates Eq. 9 using frequency error data corresponding to input frequency error Δfc (−76.664 kHz) and combination "Fxtal=18 MHz, NR=3 (frequency division), N=2 (frequency division), m=20" of the preset values, and obtains resultant correction value ΔK=−6699 of fractional frequency division ratio of variable frequency divider 102. Addition and subtraction of ΔK (−6699) from K (929987), which is included in preset data (M, K)= (63, 929987) for PLL selection fed from CPU 30, are further performed. In this case, the frequency relation between radio-frequency signals and local oscillation signals from local oscillator 7 is "lower local", so that adder-subtracter 25c performs addition. Here, the frequencies of the radio-frequency signals and local oscillation signals are mixed by mixer 6. Frequency controller 25 therefore adds correction value ΔK to K and outputs new channel selection data (M, K*)=(63, 923288) for the PLL. New channel selection data (M, K*) is supplied to variable frequency divider 102 and accumulating adder 103 via data output terminal 15 and data input terminal 14 of receiving unit 1.

PLL 10 of receiving unit 1 then updates channel selection data of the PLL. The channel selection data before the update is (M, K)=(63, 929987) preset by CPU 30. While, the channel selection data after the update is new channel selection data (M, K*)=(63, 923288) calculated by frequency controller 25. Using new channel selection data (M, K*) and reference frequency Fxtal*=18 MHz+1.8 kHz having an error with frequency accuracy+100 ppm, PLL 10 can output, from local oscillator 7, local frequency Fvco having no frequency error expressed by $$Fvco^{} = \left(M + \frac{K^*}{2^m}\right) \times N \times \frac{Fxtal^*}{NR} \quad \text{Eq. 11}$$
$$= 766.643 \text{ MHz} \approx Fvco.$$

Thus, the receiver of the present embodiment can reduce the frequency error in local oscillation signals, and hence the frequency error in the IF signals supplied from mixer 6 decreases. The pass band width of filter 8 for passing desired signals can be designed to have a band width narrower than that of the conventional one. As a result, the attenuation characteristic of filter 8 becomes steep, and the attenuation amount of unnecessary undesired signals existing near the frequency of the desired signals can be increased advantageously.

Since the frequency error in the IF signals supplied from mixer 6 decreases, the filter order can be reduced, the circuit is downsized, and the current consumption is reduced by an active filter formed of an active element. Since a large frequency error is allowed in the reference frequency signal in receiving unit 1 as discussed above, the signal source of the reference frequency signal can be formed of not an expensive oscillator such as a temperature compensated crystal oscillator but inexpensive and small quartz crystal 11.

When each of receiving unit 1, demodulating unit 2, and CPU 30 is formed of an individual semiconductor component, the update of the channel selection data of PLL 10 for correcting the frequency error does not require any dedicated terminal. Data input terminal 14 of receiving unit 1, data output terminal 15 of demodulating unit 2, and CPU connection terminal 50 exchange data between respective semiconductor components. However, these terminals may be general-purpose terminals that are generally controlled between semiconductor components. Therefore, the frequency error is corrected without using a dedicated terminal that increases the chip size of the semiconductor components.

PLL 10 is of a generally-known fractional frequency division type in the present embodiment; however, it may be of an integer frequency division type. When PLL 10 is of the fractional frequency division type, the local frequency of local oscillator 7 can be selected and controlled at a fine interval, and hence the frequency error can be corrected with higher accuracy.

In the present embodiment, received signals are of an OFDM modulation type employed in terrestrial digital broadcasting service. Frequency error detector 24 detects a frequency error with narrow-band frequency error detector 27 using signals in the guard interval durations characterized by OFDM modulated signals, and detects a frequency error with broadband frequency error detector 28 using a reference symbol called a pilot signal, in the present embodiment. However, the frequency error may be corrected using only broadband frequency error detector 28. In other words, frequency error detector 24 may detect a frequency error in signals from Fourier transformer 22. Even in this case, the order of the carrier spacing is about 1 kHz in the terrestrial digital broadcasting service, is sufficiently small with respect to the error of output frequency occurring in local oscillator 7, and hence can be used for correcting the error without problems.

The received signals are of the OFDM modulation type employed in the terrestrial digital broadcasting service in the present embodiment. However, even when the signals may be of other broadcasting type or communication type, the frequency error of the IF frequency shown in the present embodiment can be corrected using demodulating unit 2 capable of detecting the frequency error.

In the present embodiment, receiving unit 1 and demodulating unit 2 may be integrated in the same semiconductor component. Also in this case, the frequency error of the IF frequency can be corrected similarly to the present embodiment.

Exemplary Embodiment 2

Exemplary embodiment 2 of the present invention will be described with reference to FIG. 3, FIG. 4A, and FIG. 4B. Unless otherwise noted, exemplary embodiment 2 is similar to embodiment 1.

The receiver of embodiment 2 employs variable band limiting filter 208 capable of varying the pass band range instead of band limiting filter 8 of embodiment 1.

Figure 3:
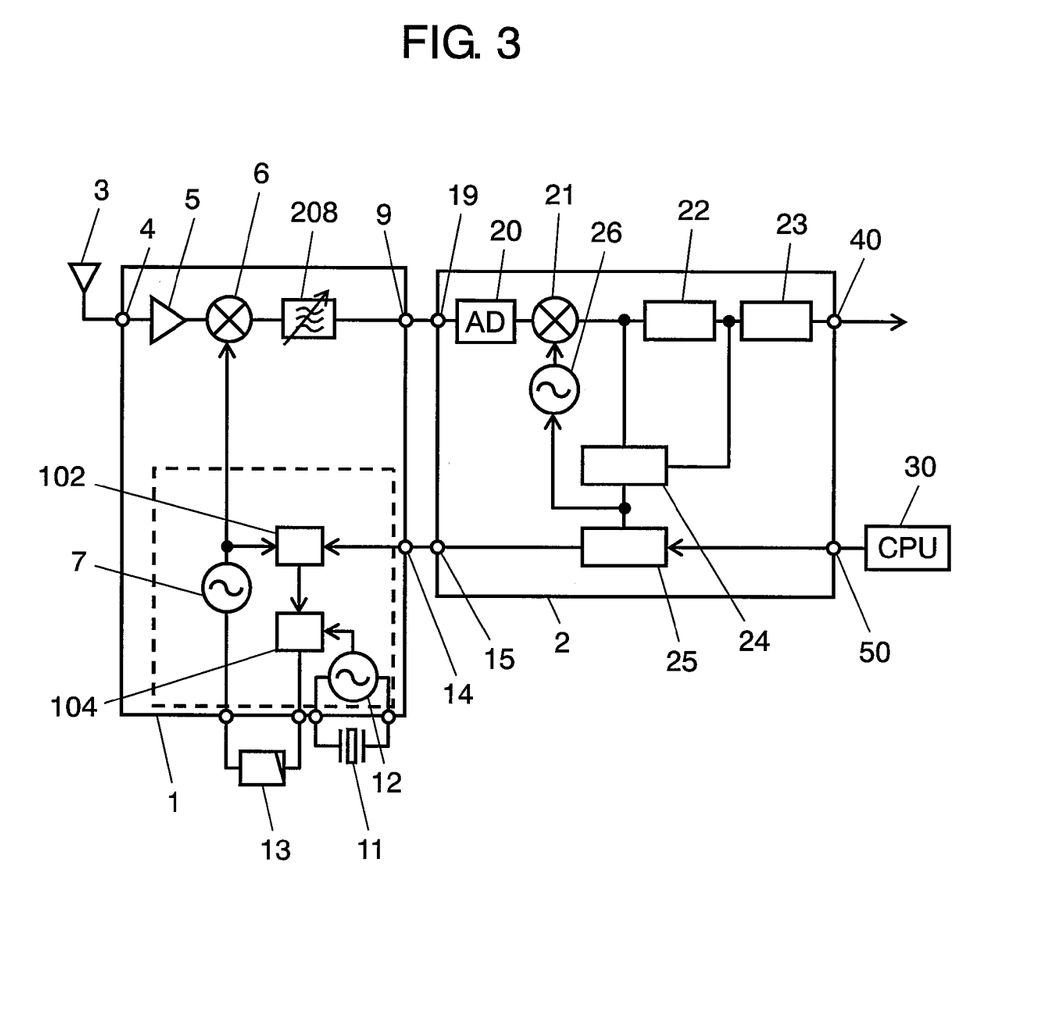
FIG. 3 is a block diagram of a receiver in accordance with exemplary embodiment 2 of the present invention.

FIG. 3 is a block diagram of a receiver in accordance with exemplary embodiment 2 of the present invention. In receiving unit 1 of the receiver of embodiment 2, radio-frequency amplifier 5, mixer 6, and variable band limiting filter 208 for passing IF signals are interconnected in that order and in the direction from input terminal 4 to demodulating unit 2, as shown in FIG. 3. A control signal for controlling the pass band range is fed from data input terminal 14 into variable band limiting filter 208. Data input terminal 14 is connected to CPU 30 via data output terminal 15 and frequency controller 25. Frequency controller 25 receives frequency error data from frequency detector 24, as described in embodiment 1. Thanks to this configuration, variable band limiting filter 208 that is connected for limiting the frequency band can vary the pass band range of signals from mixer 6 based on the signals from frequency detector 24.

Variable band limiting filter 208 preferably has a steeper attenuation characteristic in order to pass desired signals of IF signals selected by mixer 6 and suppress unnecessary undesired signals existing near the frequency of the desired signals.

The receiver of the present embodiment performs the control with CPU 30 as follows. In a receiving operation state before correcting the frequency error of the IF signals, the pass band width of variable band limiting filter 208 is increased, thereby passing the IF signals in the range that is obtained by adding a band width corresponding to the frequency error to the band width of the desired signals. While, in a receiving operation state after correcting the frequency error of the IF signals and removing the error, the pass band width of variable band limiting filter 208 is decreased, thereby passing the IF signals only in the range of the band width of the desired signals.

An example of the filter characteristic of variable band limiting filter 208 is described hereinafter with reference to FIG. 4A and FIG. 4B. FIG. 4A is a characteristic diagram of the filter where the pass band width is controlled in accordance with exemplary embodiment 2 of the present invention. FIG. 4B is a characteristic diagram of the filter where pass band width and the gradient of the attenuation characteristic are controlled in accordance with exemplary embodiment 2.

In variable band limiting filter 208 of the present embodiment, the IF signal frequency is 500 kHz, the desired signal band width is 430 kHz in the pass band, and the filter type is a band pass filter. It is also assumed that the maximum frequency error in the IF signals is ±80 kHz and interfering signals (suppressed undesired signals) exist at 1.5 MHz.

Figure 4A:
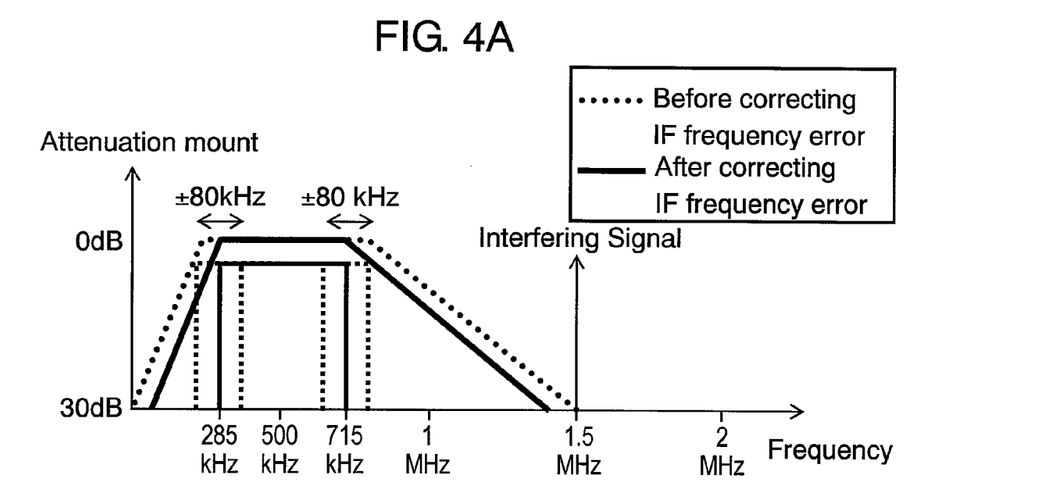
FIG. 4A is a characteristic diagram of a filter where the pass band width is controlled in accordance with exemplary embodiment 2.
Figure 4B:
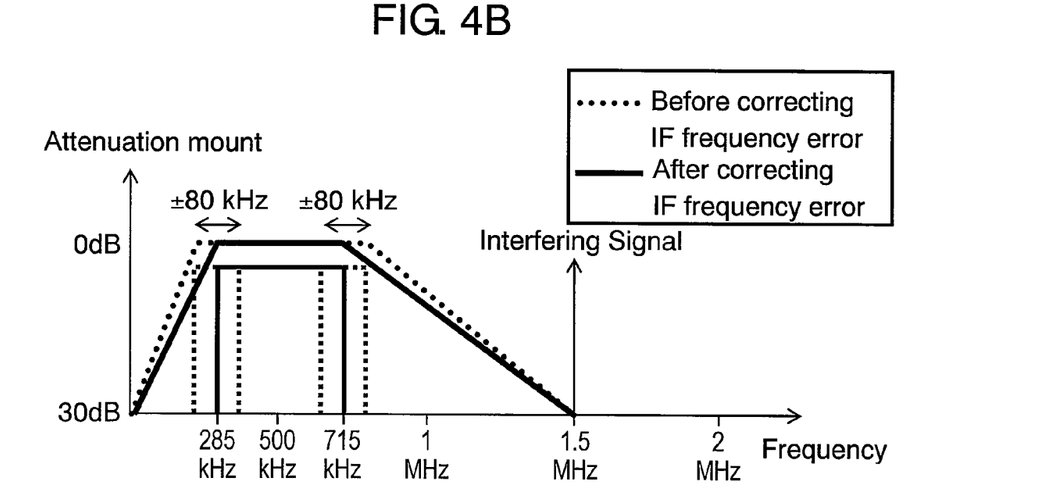
FIG. 4B is a characteristic diagram of the filter where the pass band width and the gradient of the attenuation characteristic are controlled in accordance with exemplary embodiment 2.

In FIG. 4A and FIG. 4B, the broken lines show the desired signals and filter characteristic in the operation state before correcting the frequency error of the IF signals, and solid lines show the desired signals and filter characteristic in the operation state after correcting the frequency error in the IF signals.

In the filter characteristic of variable band limiting filter 208 of FIG. 4A, only the pass band width is controlled and the gradient of the attenuation characteristic does not vary before and after correcting the frequency error of the IF signals. In this case, after correcting the frequency error of the IF signals, the pass band width can be deceased and the suppressed amount of the interfering signals can be increased. Therefore, especially, the receiving characteristic is sufficient even in a receiving environment including a large interfering signal. When an anti-alias filter is formed of a passive component between the output part of receiving unit 1 and AD converter 21 of demodulating unit 2, the anti-alias filter can be advantageously achieved with a low-order and small circuit.

In the filter characteristic of variable band limiting filter 208 of FIG. 4B, the pass band width and the gradient of the attenuation characteristic are controlled before and after correcting the frequency error in the IF signals. In this case, after controlling the frequency error in the IF signals, the pass band width decreases. In this control, the cutoff frequency approaches the IF frequency and the attenuation amount does not vary at 1.5 MHz where the interfering signals exist, so that the gradient of the attenuation characteristic becomes gentle. Therefore, especially in the filter employing an active element, the current consumption is decreased by decreasing the filter order.

The filter type is the band pass filter in embodiment 2. However, a low pass filter can also bring a similar advantage. By controlling the pass band to be variable, the receiving characteristic is increased and the current consumption is decreased.

Though there is no specification in the present embodiment, a similar advantage can be obtained even when the filter for limiting the frequency band is formed of a surface acoustic wave (SAW) filter. Especially in the receiver having a first intermediate frequency that becomes high, an SAW filter having a steep attenuation characteristic is used as the filter for limiting the frequency band in the intermediate frequency band, thereby increasing the receiving characteristic.

Exemplary Embodiment 3

Exemplary embodiment 3 of the present invention will be described with reference to FIG. 5 and FIG. 6. Unless otherwise noted, exemplary embodiment 3 is similar to embodiment 1.

Embodiment 3 differs from embodiment 1 in the configuration of frequency error detector 24 and frequency controller 25 in demodulating unit 2. Detection of frequency error Δfc in IF signals or calculation of frequency correction value ΔK based on the frequency error is not always performed.

Figure 5:
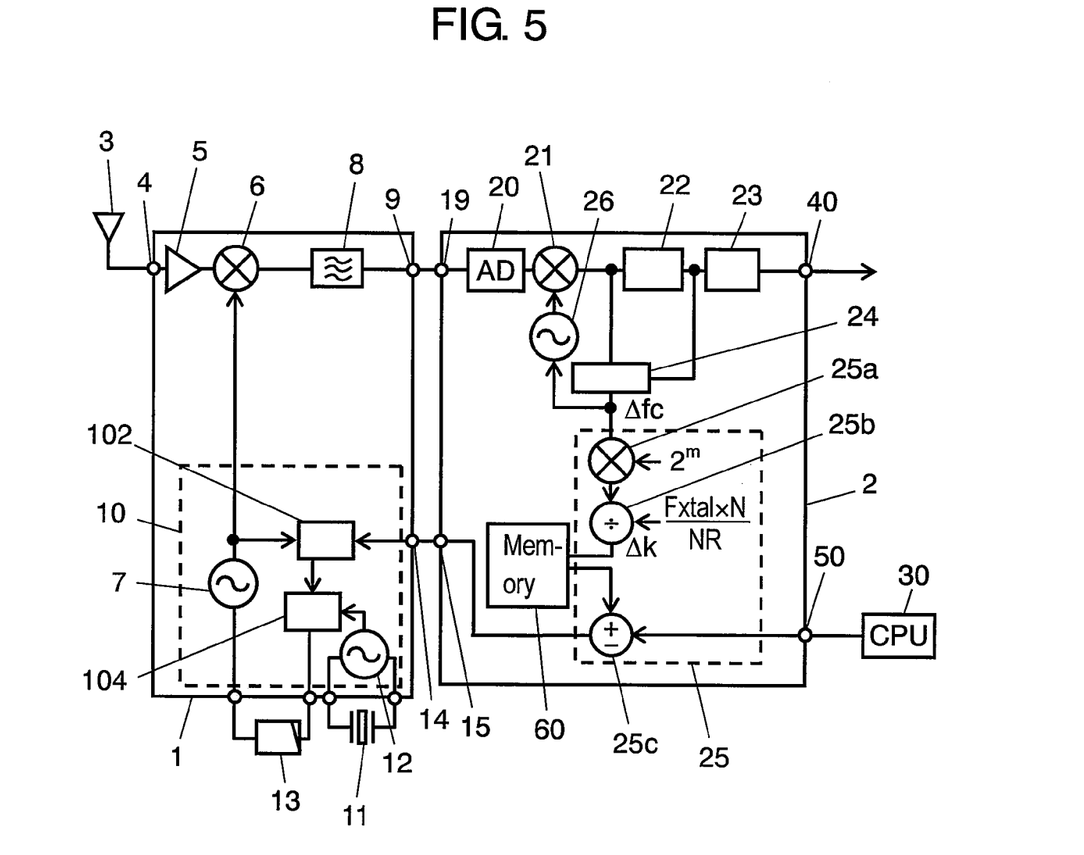
FIG. 5 is a block diagram of a receiver in accordance with exemplary embodiment 3 of the present invention.

FIG. 5 is a block diagram of a receiver in accordance with exemplary embodiment 3 of the present invention. In FIG. 5, demodulating unit 2 of the receiver has memory 60 for primarily storing data between divider 25b and adder-subtracter 25c, derives correction value ΔK of PLL 10 based on the frequency error in the IF signals with frequency controller 25, and primarily stores correction value ΔK in memory 60.

Operations of the receiver of the present embodiment are described hereinafter in detail.

When a certain channel is selected for receiving terrestrial digital broadcasting service, the receiver detects frequency error Δfc in the IF signals with frequency error detector 24 of demodulating unit 2. Multiplier 25a and divider 25b of frequency controller 25 supply calculated correction value ΔK of PLL 10 to memory 60, and memory 60 primarily stores correction value ΔK. Adder-subtracter 25c reads correction value ΔK from memory 60, performs addition and subtraction using correction value ΔK and preset data for PLL 10 selection supplied from CPU 30, and outputs the calculation result to PLL 10.

The receiver of the present embodiment can temporarily derive correction value ΔK, and then turn off multiplier 25a and divider 25b to stop these operations. Even after turning off multiplier 25a and divider 25b with the control of CPU 30, adder-subtracter 25c reads primarily stored correction value ΔK from memory 60, performs addition and subtraction using correction value ΔK and the preset data for PLL 10 selection supplied from CPU 30, and can output the calculation result to PLL 10.

Figure 6:
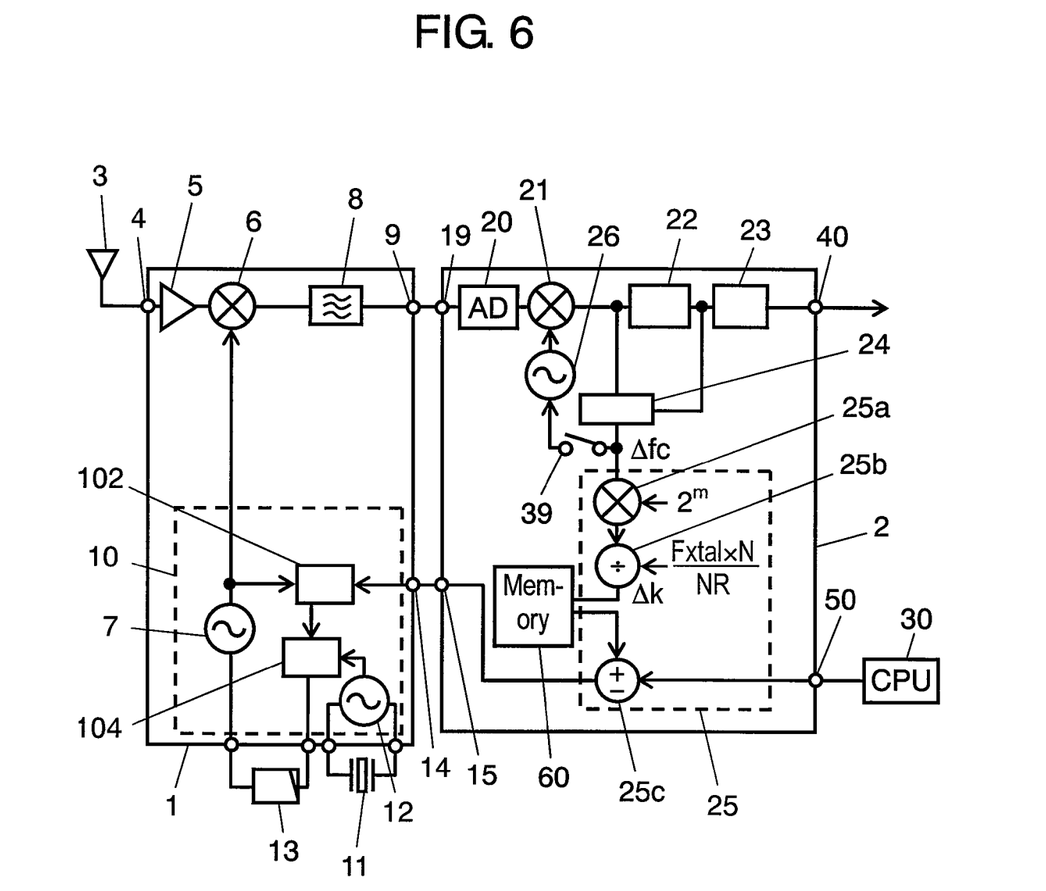
FIG. 6 is a block diagram of another receiver in accordance with exemplary embodiment 3.

As shown in FIG. 6, demodulating unit 2 of the receiver of the present embodiment may have switch 39 on the input side of multiplier 21 and the output side of frequency error detector 24. In this configuration, in the on state of switch 39, multiplier 21 and frequency error detector 24 are interconnected in a loop shape. In the off state of switch 39, multiplier 21 does not remove the frequency error, so that frequency error detector 24 detects the frequency error caused by quartz crystal 11 as it is.

Correction value ΔK to be primarily stored in memory 60 is derived in the off state of switch 39, so that the frequency error is primarily stored in memory 60 while the frequency error is not removed by multiplier 21. When correction value ΔK is primarily stored in memory 60, multiplier 25a and divider 25b are turned off. Adder-subtracter 25c performs addition and subtraction using the preset data for PLL 10 selection supplied from CPU 30 and correction value ΔK read from memory 60, and outputs the calculation result to PLL 10.

PLL 10 is of fractional frequency division type, and selects output frequency of local oscillator 7 at a fine interval. Therefore, the frequency errors in the local oscillation signals and the IF signals are accurately corrected. Therefore, the correction of the frequency error in multiplier 21 is not so required, and frequency error detector 24, multiplier 25a, and divider 25b may be turned off.

The receiver of the present embodiment does not always perform detection of frequency error in the IF signals, calculation of frequency correction value ΔK based on the frequency error, and frequency correction in demodulating unit 2, and circuits corresponding to these operations are turned off. Thus, the current consumption can be reduced advantageously.

In the receiver of the present embodiment, frequency correction value ΔK is primarily stored in memory 60 at timing after one derivation. However, even when the number of primarily storing in memory 60 and timing are changed, similar advantage can be obtained. For example, CPU 30 may command correction value ΔK to be primarily stored in memory 60, and may regularly perform the command of primary storing under control with a timer. When variation in the operation environment such as rapid temperature variation causes shift in reference signal frequency of PLL 10, correction value ΔK primarily stored in memory 60 instantaneously becomes inappropriate. Therefore, the receiving characteristic can decrease. In this state, the bit error rate (BER) indicating the receiving characteristic after demodulation may be monitored, and correction value ΔK to be stored in memory 60 may be updated in response to the decrease in BER.

Exemplary Embodiment 4

Exemplary embodiment 4 of the present invention will be described with reference to FIG. 7. Unless otherwise noted, exemplary embodiment 4 is similar to embodiment 1.

In embodiment 4, the calculation (Eq. 9) that is performed by frequency controller 25 (FIG. 2) of demodulating unit 2 in embodiment 1 is performed with software or the like on CPU 30.

Figure 7:
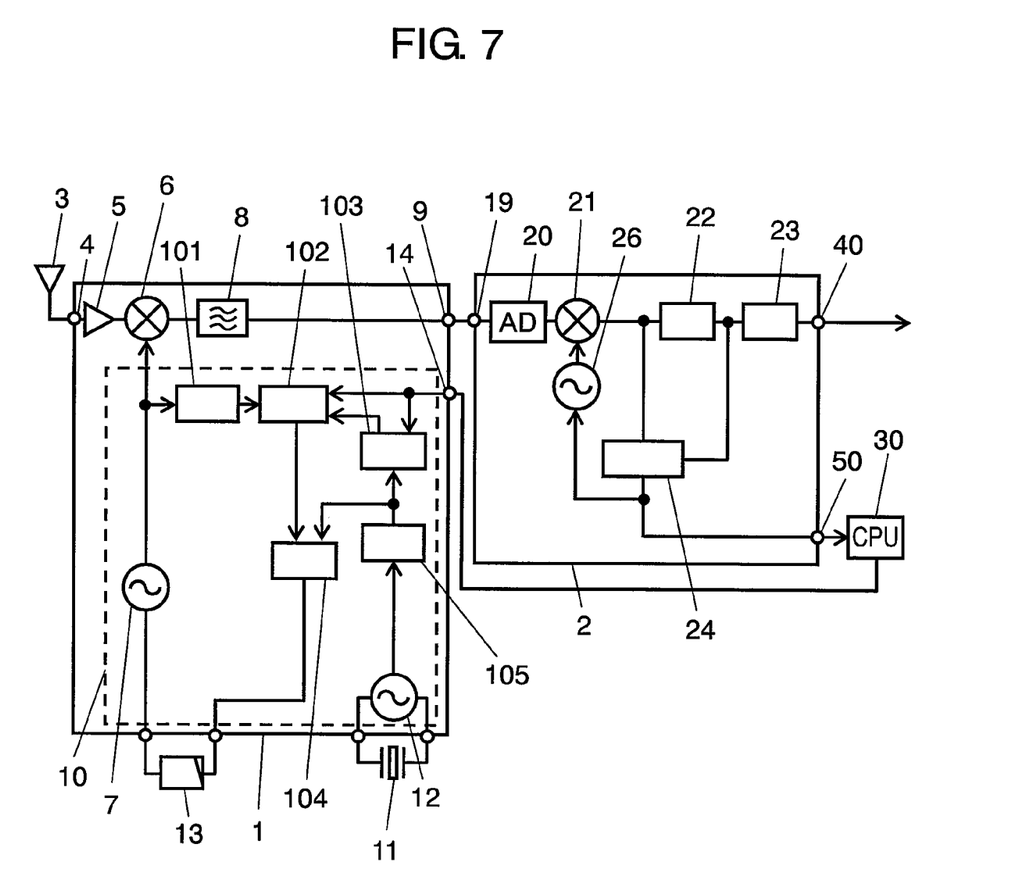
FIG. 7 is a block diagram of a receiver in accordance with exemplary embodiment 4 of the present invention.

FIG. 7 is a block diagram of a receiver in accordance with exemplary embodiment 4 of the present invention. In FIG. 7, frequency error Δfc in IF signals detected by frequency error detector 24 of demodulating unit 2 of the receiver is read by CPU 30 via CPU connection terminal 50. CPU 30 calculates correction value ΔK (Eq. 9) using the following parameters:

read frequency error Δfc;

reference signal frequency "Fxtal" that is determined by the circuitry of PLL 10 and preset by CPU 30;

frequency division ratio "NR" of reference frequency divider 105;

frequency division ratio "N" of pre-scaler 101; and bit number "m" of accumulating adder 103.

CPU 30 calculates new channel selection data (M, K±ΔK) based on selection preset data (M, K) of PLL 10 and correction value ΔK, and supplies the new channel selection data to PLL 10 via data input terminal 14 of receiving unit 1.

Using the new channel selection data, PLL 10 can remove the frequency error from the local oscillation signals supplied from local oscillator 7, and can also remove frequency error from IF signal frequency.

The receiver of the present embodiment performs, with the software of CPU 30, the calculation (Eq. 9) that is performed by frequency controller 25 in embodiment 1. Correction value ΔK calculated by CPU 30 is determined with the accuracy of the reference signal frequency that hardly causes instantaneous variation, so that the calculation can be easily achieved at a low calculation speed to which even the software of CPU 30 can be respond. CPU 30 calculates Eq. 9 using the condition of each circuit constituting PLL 10 and set values set by the CPU, except for Δfc calculated by demodulating unit 2. Therefore, the calculation by the software facilitates change of the circuit of PLL 10 of receiving unit 1, for example.

INDUSTRIAL APPLICABILITY

A receiver of the present invention can reduce the frequency error in local oscillation signals with the above-mentioned configuration. Thus, the attenuation characteristic of a filter becomes steep, and the attenuation amount of unnecessary undesired signals existing near the frequency of desired signals can be increased. The receiver can be used in a TV or portable terminal mounted on an automobile.

We claim:

1. A receiver comprising:
    an input terminal;
    a receiving unit coupled to the input terminal;
    a demodulating unit coupled to an output side of the receiving unit; and
    an output terminal coupled to an output side of the demodulating unit, the receiving unit including:
        a PLL;
        a mixer for mixing a local oscillation signal from the PLL and a signal from the input terminal; and
        a filter coupled to an output side of the mixer,
    the demodulating unit including:
        a frequency error detector for detecting a frequency error in a signal from the filter;
        a CPU for setting a frequency division ratio including an integer portion and a fractional portion; and
        a frequency controller for computing a correction value based on the detected frequency error and for computing a corrected frequency division ratio by adding or subtracting the correction value to the fractional portion of the frequency division ratio;
    the PLL including:
        a local oscillator for supplying the local oscillation signal to the mixer;
        a variable frequency divider for frequency-dividing the local oscillation signal from the local oscillator at the corrected frequency division ratio;
        an oscillator; and
        a phase comparator that is coupled to an input side of the local oscillator and compares a signal from the variable frequency divider with a signal from the oscillator.

2. The receiver of claim 1, wherein
    the demodulating unit comprises:
        an AD converter coupled to an output side of the filter;
        a multiplier coupled to an output side of the AD converter; and
        a Fourier transformer coupled between the multiplier and the output terminal, and
    the frequency error detector detects a frequency error in a signal from the Fourier transformer.

3. The receiver of claim 1, wherein
    the demodulating unit comprises:
        an AD converter coupled to an output side of the filter;
        a multiplier coupled to an output side of the AD converter; and
        a Fourier transformer coupled between the multiplier and the output terminal, and the frequency error detector detects a frequency error based on a signal from the multiplier before Fourier transformation by the Fourier transformer and a signal after the Fourier transformation by the Fourier transformer.

4. The receiver of claim 1, wherein
the filter can vary a pass band range of a signal from the mixer based on a signal from the frequency error detector.

5. The receiver of claim 1, further comprising a memory that is disposed between the frequency error detector and the variable frequency divider and stores the frequency error.

6. The receiver of claim 1, wherein
the demodulating unit further comprises:
  a multiplier coupled to an output side of the filter,
  the multiplier and the frequency error detector are intercoupled in a loop shape, and
  a switch is disposed on an input side, which is an output side of the frequency error detector, of the multiplier.

7. An electronic apparatus comprising:
an input terminal;
a receiving unit coupled to the input terminal;
a demodulating unit coupled to an output side of the receiving unit;
an output terminal coupled to an output side of the demodulating unit;
a signal processor coupled to the output terminal; and
a display unit coupled to the signal processor,
the receiving unit including:
  a PLL;
  a mixer for mixing a local oscillation signal from the PLL and a signal from the input terminal; and
  a filter coupled to an output side of the mixer,
the demodulating unit including:
  a frequency error detector for detecting frequency error in a signal from the filter;
  a CPU for setting a frequency division ratio including an integer portion and a fractional portion; and
  a frequency controller for computing a correction value based on the detected frequency error and for computing a corrected frequency division ratio by adding or subtracting the correction value to the fractional portion of the frequency division ratio;
the PLL including:
  a local oscillator for supplying the local oscillation signal to the mixer;
  a variable frequency divider for frequency-dividing the local oscillation signal from the local oscillator at the corrected frequency division ratio;
  an oscillator; and
  a phase comparator that is coupled to an input side of the local oscillator and compares a signal from the variable frequency divider with a signal from the oscillator.

8. A receiver for receiving an OFDM signal comprising:
an input terminal;
a receiving unit coupled to the input terminal;
an OFDM signal demodulating unit coupled to an output side of the receiving unit; and
an output terminal coupled to an output side of the OFDM signal demodulating unit,
the receiving unit including:
  a fractional frequency division PLL;
  a mixer for mixing a local oscillation signal from the fractional frequency division PLL and a signal from the input terminal; and
  a filter coupled to an output side of the mixer,
the OFDM signal demodulating unit including:
  a multiplier coupled to an output side of the filter;
  a frequency error detector for detecting a frequency error in a signal from the multiplier, coupled to an output side of the multiplier; and
  a numerically controlled oscillator coupled to an output side of the frequency error detector,
  the multiplier to which output signals of the numerically controlled oscillator are supplied, removing frequency error,
the fractional frequency division PLL including:
  a local oscillator for supplying the local oscillation signal to the mixer;
  a variable frequency divider for frequency-dividing the local oscillation signal from the local oscillator at a frequency division ratio that is determined by performing addition and subtraction using a correction value and preset data for fractional frequency division PLL selection supplied from a CPU, the correction value being derived based on the frequency error detected by the frequency error detector without removing the frequency error by the multiplier at a timing of selecting a desired channel;
  an oscillator; and
  a phase comparator that is coupled to an input side of the local oscillator and compares a signal from the variable frequency divider with a signal from the oscillator.

* * * * *

UNITED STATES PATENT AND TRADEMARK OFFICE
CERTIFICATE OF CORRECTION

PATENT NO. : 7,733,986 B2  Page 1 of 1
APPLICATION NO. : 11/572942
DATED : June 8, 2010
INVENTOR(S) : Fujii et al.

It is certified that error appears in the above-identified patent and that said Letters Patent is hereby corrected as shown below:

On the Title page, item (86), PCT No.:

"PCT/JP2006/011505" should read --PCT/JP2006/311505--.

Signed and Sealed this

Thirty-first Day of August, 2010

David J. Kappos
*Director of the United States Patent and Trademark Office*